United States Patent
Jang et al.

(10) Patent No.: US 6,174,808 B1
(45) Date of Patent: Jan. 16, 2001

(54) INTERMETAL DIELECTRIC USING HDP-CVD OXIDE AND SACVD O$_3$-TEOS

(75) Inventors: Syun-Ming Jang, Hsin-Chu; Chu-Yun Fu, Taipei, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/366,740

(22) Filed: Aug. 4, 1999

(51) Int. Cl.[7] ................................................. H01L 21/44
(52) U.S. Cl. ..................... 438/680; 438/424; 438/427; 438/437; 438/435; 438/637; 438/638; 438/646; 438/787; 438/789; 438/190; 438/195
(58) Field of Search ................................. 438/680, 435, 438/638, 637, 424, 437, 719, 646, 787, 427, 190, 195

(56) References Cited

U.S. PATENT DOCUMENTS

| 5,518,959 | * | 5/1996 | Jang et al. | 438/190 |
| 5,536,681 | * | 7/1996 | Jang et al. | 438/195 |
| 5,605,859 | | 2/1997 | Lee | 437/60 |
| 5,650,359 | | 7/1997 | Ahlburn | 437/235 |
| 5,656,556 | | 8/1997 | Yang | 438/646 |
| 5,731,241 | | 3/1998 | Jang et al. | 438/424 |
| 5,741,740 | * | 4/1998 | Jang et al. | 438/435 |
| 5,773,361 | | 6/1998 | Cronin et al. | 438/637 |
| 5,786,278 | | 7/1998 | Fry | 438/787 |
| 6,001,735 | * | 12/1999 | Tsai | 438/638 |

* cited by examiner

Primary Examiner—Matthew Smith
Assistant Examiner—Belur Keshavan
(74) Attorney, Agent, or Firm—George O. Saile; Stephen B. Ackerman; Stephen G. Stanton

(57) ABSTRACT

Method for forming an inter-level dielectric layer upon a substrate employed within a microelectronics fabrication. There is first provided a substrate. There is then formed upon the substrate a patterned microelectronics layer. There is then formed upon and between the patterned microelectronics layer and substrate a blanket first silicon oxide layer employing high density plasma chemical vapor deposition. There is then an optional exposure of the first blanket silicon oxide layer to a nitrogen plasma treatment prior to formation thereupon of a second blanket silicon oxide dielectric layer employing ozone assisted sub-atmospheric pressure thermal chemical vapor deposition, where the nitrogen plasma exposure results in improved gap fill within the silicon oxide dielectric layer, whereas avoidance of exposure to the nitrogen plasma results in formation of voids within the blanket second silicon oxide dielectric layer, leading to lower capacitance. There is then formed over the silicon oxide dielectric layer a capping blanket dielectric layer of silicon oxide formed employing plasma enhanced chemical vapor deposition.

32 Claims, 3 Drawing Sheets

INTERMETAL DIELECTRIC USING HDP-CVD OXIDE AND SACVD O$_3$-TEOS

BACKGROUND OF THE INVENTION

1. Field of the Invention

This invention relates generally to the field of dielectric layers employed within microelectronics fabrications, and more particularly to methods for forming silicon oxide dielectric layers for inter-level metal layer separation within microelectronics fabrications.

2. Description of the Related Art

Microelectronics fabrications employ dielectric layers for electrical isolation and separation of conductive layers used to interconnect circuits within the microelectronics fabrication. When multiple levels of conductor layers are required to interconnect the high density of devices currently being fabricated within microelectronics fabrications, their separation is accomplished by inter-level metal dielectric (IMO) layers.

Silicon containing dielectric materials may be formed into inter-level metal dielectric (IMD) layers useful for employment in microelectronics fabrications by chemical vapor deposition (CVD) methods. In particular, silicon oxide dielectric layers formed by plasma enhanced chemical vapor deposition (PECVD) methods are well suited for these purposes because of the high quality of the physical and electrical properties of such materials. On the other hand, silicon oxide dielectric layers formed by ozone assisted sub-atmospheric pressure thermal chemical vapor deposition (SACVD) methods are of lesser quality but generally form planarized, rather than conformal, gap filling layers having reasonably smooth, flat surfaces suitable for further photolithographic pattern formation processes. The degree of formation of voids or defects in silicon oxide dielectric layers formed by SACVD methods is determined by various forms of surface treatment prior to deposition. For example, the exposure of an underlying surface of a silicon containing dielectric layer to a plasma treatment often minimizes formation of voids in the subsequently deposited silicon oxide layer.

As the dimensions of features employed in microelectronics fabrications continue to diminish, the need for deposited dielectric layers to fill in narrow gaps without formation of voids or other defects has exceeded the capability of conventional methods for forming gap filling silicon oxide dielectric layer to fulfill the requirements without problems being encountered, in particular with respect to inter-level dielectric layers formed employing SACVD methods having sufficiently good quality dielectric properties suitable for formation thereon of further patterned microelectronics conductor layers.

It is therefore towards the goal of forming inter-level metal (IMD) dielectric layers employing silicon oxide dielectric layers with improved gap filling formed by chemical vapor deposition (CVD) methods that the present invention is more generally directed.

Various methods have been disclosed within the art of microelectronics fabrication for forming upon a substrate employed within a microelectronics fabrication an inter-level metal dielectric (IMD) layer upon and between patterned microelectronics layers.

For example, Lee, in U.S. Pat. No. 5,605,859, discloses a method for forming a dielectric layer over a polysilicon resistor layer while employing plasma enhanced chemical vapor deposition (PECVD) from silane to form a silicon oxide dielectric layer. The polysilicon layer has already been formed upon a glasseous dielectric layer, so that the silicon oxide layer is deposited partly over the glasseous layer.

Further, Yang, in U.S. Pat. No. 5,656,556, discloses a method for forming a planar insulating layer comprising four layers of borophosphosilicate glass, each formed with different doping concentrations of boron and phosphorus so that the corresponding temperatures vary from higher for the first layer to lower temperatures for succeeding layers. The final layer employs low doping concentrations to enable it to function as a capping layer to minimize moisture absorption by the lower layers.

Still further, Ahlburn, in U.S. Pat. No. 5,650,359, discloses a composite dielectric layer for final passivation of an integrated circuit. The layer first employs TEOS in a PECVD process to form a silicon oxide layer 2000 angstroms thick, followed by SACVD in O$_3$-TEOS to form a second layer of silicon oxide 8000 angstroms thick, and then a silicon nitride layer formed by CVD process to a thickness of 10,000 angstroms.

Yet still further, Jang et al., in U.S. Pat. No. 5,731,241, disclose a method for forming a protective dielectric layer over a trench oxide layer to prevent over-etching of the trench oxide layer. The protective dielectric layer is formed employing O$_3$-TEOS in a SACVD method.

Yet further still, Jang et al., in U.S. Pat. No. 5,741,740, disclose a method for forming a dielectric layer for shallow trench isolation (STI) wherein a conformal silicon oxide layer is first formed in the trench employing silane in a PECVD process, and then a gap filling silicon oxide is formed over the trench and conformal first silicon oxide layer employing SACVD in O$_3$-TEOS.

Still yet further, Cronin et al., in U.S. Pat. No. 5,773,361, disclose a method for forming microcavities within dielectric layers. The method employs a void-forming dielectric material such as borophosphosilicate glass (BPSG) formed over a substrate having topography such that voids will form in a desired location. A second layer having a greater density than the void-forming material is then formed over the void-forming material. After suitable annealing such as Rapid Thermal Anneal (RTA), the dielectric layer is chemical mechanical polish (CMP) planarized to expose the top of the void. Anisotropic etching is then employed to remove sufficient void-forming material to form a contact via hole.

Finally, Fry, in U.S. Pat. No. 5,786,278, discloses a method for changing the tensile stress in a dielectric layer formed employing O$_3$-TEOS in a SACVD process to a compressive stress. The method employs exposure of the silicon oxide dielectric layer to pressures above atmospheric pressure at temperatures below the stress conversion temperature for the dielectric layer at atmospheric pressure to bring about the conversion of stress.

Desirable in the art of microelectronics fabrication are additional methods for forming upon a substrate within a microelectronics fabrication an inter-level metal dielectric (IMD) layer formed between and upon patterned conductor layers. More particularly desirable in the art of microelectronics fabrication are methods for forming upon a substrate within a microelectronics fabrication an inter-level metal dielectric layer employing silicon oxide dielectric materials formed with controlled void content disposed around patterned conductor layers.

It is towards the foregoing goals that the present invention is generally and more specifically directed.

SUMMARY OF THE INVENTION

A first object of the present invention is to provide a method for forming upon a substrate within a microelectronics fabrication an inter-level metal dielectric layer disposed between and around patterned microelectronics layers.

A second object of the present invention is to provide a method in accord with the first object of the present invention where the inter-level metal dielectric layer disposed between and around patterned conductor layers is formed with or without voids as desired.

A third object of the present invention is to provide a method in accord with the first object of the present invention or the second object of the present invention where the inter-level metal dielectric layer is formed employing silicon oxide dielectric materials successively deposited by chemical vapor deposition (CVD) methods.

A fourth object of the present invention is to provide a method in accord with the first object of the present invention, the second object of the present invention, and/or the third object of the present invention, where the silicon oxide inter-level metal dielectric layer is formed with controlled void content.

A fifth object of the present invention is to provide a method in accord with the first object of the present invention, the second object of the present invention, the third object of the present invention and/or the fourth object of the present invention, where the method is readily commercially implemented.

In accord with the objects of the present invention, there is provided by the present invention a method for forming upon a substrate within a microelectronics fabrication an inter-level metal dielectric layer disposed between and around patterned microelectronics layers. To practice the method of the present invention, there is first provided a substrate. There is then formed upon the substrate a patterned microelectronics layer. There is then formed disposed between and around the patterned microelectronics conductor layer an inter-level metal dielectric layer formed of silicon oxide dielectric materials successively deposited by chemical vapor deposition (CVD) methods, wherein an optional exposure or non-exposure of the first dielectric layer to a nitrogen plasma treatment prior to formation of the second dielectric layer attenuates or maximizes respectively the void content of the dielectric layer.

The method of the present invention employs silicon oxide dielectric materials to form the inter-level metal dielectric layer. Silicon oxide dielectric materials are deposited employing methods including but not limited to chemical vapor deposition (CVD) methods, plasma enhanced chemical vapor deposition (PECVD) methods, sub-atmospheric pressure thermal chemical vapor deposition (SACVD) methods, high pressure plasma chemical vapor deposition (HDP-CVD) methods, atmospheric pressure chemical vapor deposition (APCVD) methods and sputtering methods.

The method of the present invention employs methods and materials as are known in the art of microelectronics fabrication, but in a novel order and sequence, to obtain an inter-level metal dielectric layer formed employing silicon oxide dielectric materials with controlled voids content. Therefore the method of the present invention is readily commercially implemented.

BRIEF DESCRIPTION OF THE DRAWINGS

The objects, features and advantages of the present invention are understood within the context of the Description of the Preferred Embodiments as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming upon a substrate employed within a microelectronics fabrication an inter-level metal dielectric layer, disposed between and around a patterned microelectronics layer, formed employing chemical vapor deposition (CVD) methods to successively deposit silicon oxide dielectric materials to form said inter-level metal dielectric layer.

The present invention provides a method for forming upon a substrate employed within a microelectronics fabrication an inter-level metal dielectric layer, disposed between and around a patterned microelectronics conductor layer, formed employing a first silicon oxide dielectric material deposited by high-density plasma chemical vapor deposition (HDP-CVD) and a second silicon oxide dielectric material upon the first layer employing sub-atmospheric pressure thermal chemical vapor deposition (SACVD), wherein the void content of said second silicon oxide dielectric layer is controlled by the degree of exposure of the first silicon oxide dielectric layer to a nitrogen plasma prior to deposition of the second silicon oxide dielectric layer. The method of the present invention may be practiced in microelectronics fabrications including but not limited to integrated circuit microelectronics fabrications, charge coupled device microelectronics fabrications, solar cell microelectronics fabrications, ceramics substrate microelectronics fabrications and flat panel display microelectronics fabrications.

First Preferred Embodiment

Figure 1:
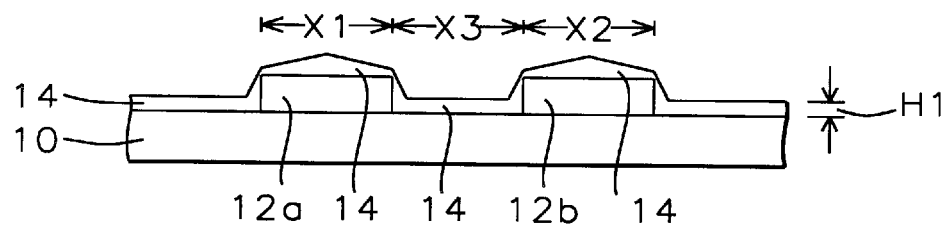
FIG. 1, FIG. 2, FIG. 3 and FIG. 4 are directed towards a general embodiment of the present invention which constitutes a first preferred embodiment of the present invention. Shown in FIG. 1 to FIG. 4 is a series of schematic cross-sectional drawings illustrating the results of forming upon a substrate employed within a microelectronics fabrication an inter-level metal dielectric layer formed between and around a patterned microelectronics layer.

Referring now to FIG. 1 to FIG. 4, there is shown a series of schematic cross-sectional diagrams illustrating the results of forming upon a substrate employed within a microelectronics fabrication in accord with a general embodiment of the present invention which constitutes a first preferred embodiment of the present invention an inter-level dielectric layer formed employing silicon oxide dielectric materials, successively deposited by chemical vapor deposition (CVD) methods, wherein the internal void content of said silicon oxide dielectric materials is minimized by exposure of the first silicon oxide dielectric layer to a nitrogen plasma prior to deposition of the second silicon oxide dielectric layer. FIG. 1 is a schematic cross-sectional diagram of the microelectronics fabrication at an early stage in fabrication.

Shown in FIG. 1 is a substrate 10 employed within a microelectronics fabrication, where the substrate 10 has formed upon it a patterned microelectronics layer 12a and 12b. Formed over and around the patterned microelectronics layer 12a and 12b is blanket first silicon oxide dielectric layer 14. The patterned microelectronics layer 12a and 12b comprises lines of width X1 and X2 separated by a gap X3. The blanket dielectric layer 14 is formed to a thickness of H1 over the substrate 10.

With respect to the substrate 10, the substrate 10 may be the substrate itself employed within a microelectronics fabrication selected from the group including but not limited to integrated circuit microelectronics fabrications, charge coupled device microelectronics fabrications, solar cell microelectronics fabrications, ceramics substrate microelectronics fabrications and flat panel display microelectronics fabrications. Alternatively, the substrate 10 may be any of several microelectronics layers formed upon a substrate employed within a microelectronics fabrication. The microelectronics layers employed within the microelectronics fabrication may include but are not limited to microelectronics conductor layers, microelectronics semiconductor layers and microelectronics dielectric layers.

With respect to the patterned microelectronics layers 12a and 12b, the patterned microelectronics layers 12a and 12b may be formed from microelectronics materials including but not limited to microelectronics conductor layers, microelectronics semiconductor layers and microelectronics dielectric layers patterned employing methods and materials as are known in the art of microelectronics fabrication. Preferably, the patterned microelectronics layers 12a and 12b are formed employing microelectronics conductor materials deposited employing methods including but not limited to thermal vacuum evaporation methods, electron beam assisted evaporation methods, sputtering methods, chemical vapor deposition (CVD) methods and ion plating methods. Preferably, the microelectronics layers 12a and 12b are formed to linewidths X1 and X2 of from about 0.2 to about 1.0 microns, with a gap X3 from about 0.2 to about 1.0 microns.

With respect to the blanket first silicon oxide dielectric layer 14 shown in FIG. 1, the blanket first silicon oxide dielectric layer 14 is formed employing high density plasma chemical vapor deposition (HDP-CVD) method. Preferably, the silicon oxide layer is formed employing the following conditions: (1) silane ($SiH_4$) gas flow rate of from about 50 to about 70 standard cubic centimeters per minute (sccm); (2) oxygen gas flow rate of from about 90 to about 110 standard cubic centimeters per minute (sccm); (3) argon carrier gas flow rate of from about 100 to about 130 standard cubic centimeters per minute (sccm); (4) total reactor chamber pressure of from about 6 to about 8 mTorr; (5) source power of from about 4000 to about 5000 watts; (6) bias power of from about 2500 to about 3000 watts; and (7) temperature of from about 380 to about 420 centigrade. Preferably, the blanket first silicon oxide layer is formed to a thickness H1 from about 700 to about 1200 angstroms The thickness profile of the first silicon oxide dielectric layer over the topography of the patterned microelectronics layer is improved by being more tapered at the top metal corners compared to silicon oxide dielectric layers formed by plasma enhanced chemical vapor deposition (PECVD).

Figure 2:
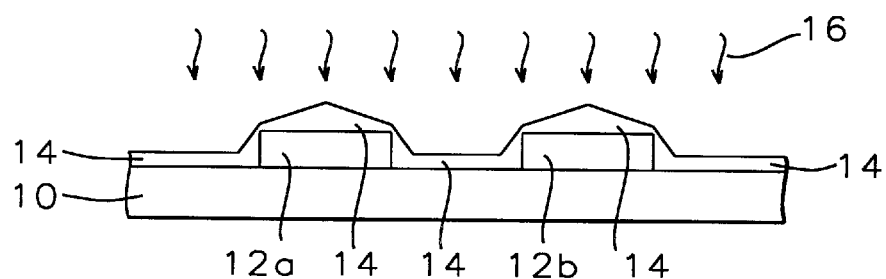

Referring now to FIG. 2, there is shown a schematic cross-sectional diagram illustrating the results of further processing of the microelectronics fabrication whose schematic cross-sectional diagram is shown in FIG. 1 in accord with the first preferred embodiment of the present invention. Shown in FIG. 2 is a microelectronics fabrication otherwise equivalent to the microelectronics fabrication shown in FIG. 1, but where there has been exposed the surface of the blanket first silicon oxide dielectric layer 14 to a nitrogen plasma 16.

With respect to the nitrogen plasma 16 shown in FIG. 2, the nitrogen plasma 16 is preferably formed and used employing the following conditions: (1) chamber pressure of from about 1 to about 2 torr; (2) nitrogen gas flow rate of from about 400 to about 600 standard cubic centimeters per minute (sccm); (3) helium carrier gas from about 1500 to about 2500 standard cubic centimeters per minute (sccm); (4) power of from about 400 to about 600 watts; (4) temperature of from about 380 to about 420 degrees centigrade; (5) exposure time of from about 60 to about 120 seconds; and (6) susceptor spacing of from about 0.4 to about 0.5 inches.

Figure 3:
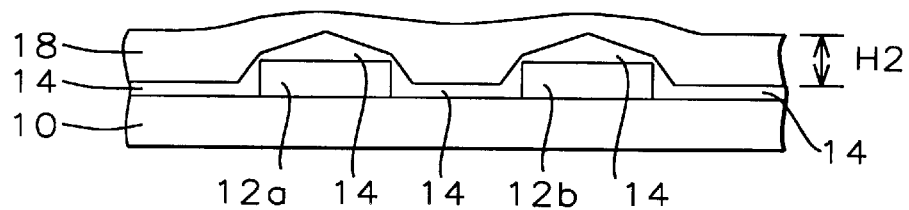

Referring now to FIG. 3, there is shown a schematic cross-sectional diagram illustrating the results of further processing of the microelectronics fabrication whose schematic cross-sectional diagram is shown in FIG. 2 in accord with the first preferred embodiment of the present invention. Shown in FIG. 3 is a microelectronics fabrication otherwise equivalent to the microelectronics fabrication shown in FIG. 2, but where there has been formed a blanket second silicon oxide dielectric layer 18 of thickness H2 over the substrate.

With respect to the blanket second silicon oxide dielectric layer 18, the blanket second silicon oxide dielectric layer 18 is formed of a gap filling silicon oxide dielectric material deposited employing ozone assisted sub-atmospheric pressure thermal chemical vapor deposition (SACVD) from ozone ($O_3$) gas and tetra-ethyl-ortho-silicate (TEOS) vapor. The blanket second silicon oxide dielectric layer 18 is formed employing preferably the following conditions: (1) TEOS vapor flow rate of from about 250 to about 350 milligrams per minute; (2) ozone gas flow rate of from about 4500 to about 5300 standard cubic centimeters per minute (sccm); (3) temperature of from about 380 to about 450 degrees centigrade; (4) helium gas flow rate of from about 3500 to about 4500 standard cubic centimeters per minute (sccm); (5) chamber pressure of from about 400 to about 500 torr; and (6) susceptor spacing of from about 0.20 to about 0.25 inches. The blanket second silicon oxide layer 18 is preferably formed to a thickness H2 of from about 3000 to about 6000 angstroms, depending on the height of the conductor.

Figure 4:
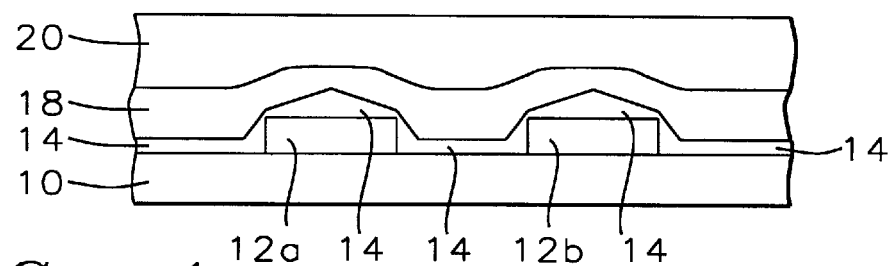

Referring now to FIG. 4, there is shown a schematic cross-sectional diagram illustrating the results o further processing of the microelectronics fabrication whose schematic cross-sectional diagram is shown in FIG. 3 in accord with the first preferred embodiment of the present invention. Shown in FIG. 4 is a microelectronics fabrication otherwise equivalent to the microelectronics fabrication shown in FIG.

3, but where there has been formed over the substrate a blanket dielectric layer 20 as a cap layer over the substrate.

With respect to the blanket dielectric layer 20, the blanket dielectric layer 20 is preferably a gap filling silicon oxide dielectric layer formed employing a plasma enhanced chemical vapor deposition (PECVD) method. Preferably, the PECVD method employs the following conditions: (1) TEOS gas flow rate of from about 800 to about 1200 milligrams/minute; (2) oxygen gas flow rate of from about 800 to about 1200 standard cubic centimeters per minute (sccm); (3) chamber pressure of from about 7.5 to about 8.5 torr; (4) power of from about 800 to about 1000 watts; (5) temperature of from about 380 to about 420 degrees centigrade; (6) susceptor spacing of from about 0.25 to about 0.30 inches; and (7) helium gas flow rate of from about 800 to about 1200 standard cubic centimeters per minute (sccm). Preferably, the blanket dielectric layer 20 is formed to a thickness of from about 15000 to about 20000 angstroms The method of the first preferred embodiment of the present invention has resulted in forming an inter-level dielectric layer upon a patterned microelectronics layer upon a microelectronics fabrication where the inter-level dielectric layer is formed free of voids.

Second Preferred Embodiment

Figure 5:
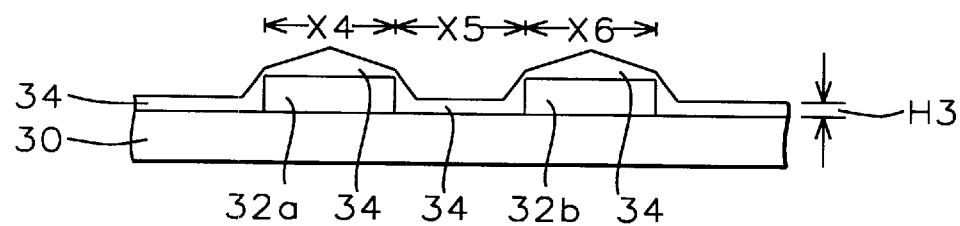
FIG. 5, FIG. 6, and FIG. 7 are directed towards a more specific embodiment of the present invention which constitutes a second preferred embodiment of the present invention. Shown in FIG. 5 to FIG. 7 is a series of schematic cross-sectional diagrams illustrating the results of forming upon a substrate employed within a microelectronics fabrication an inter-level metal dielectric layer formed of silicon oxide dielectric materials, between and around a patterned microelectronics conductor layer, employing chemical vapor deposition (CVD) methods, with controlled void content of the silicon oxide dielectric layer.
Figure 6:
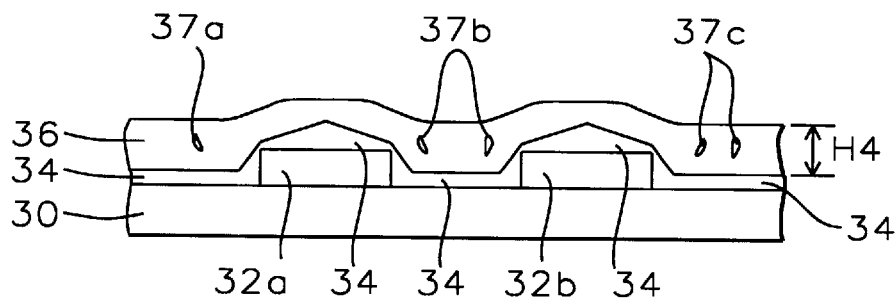
Figure 7:
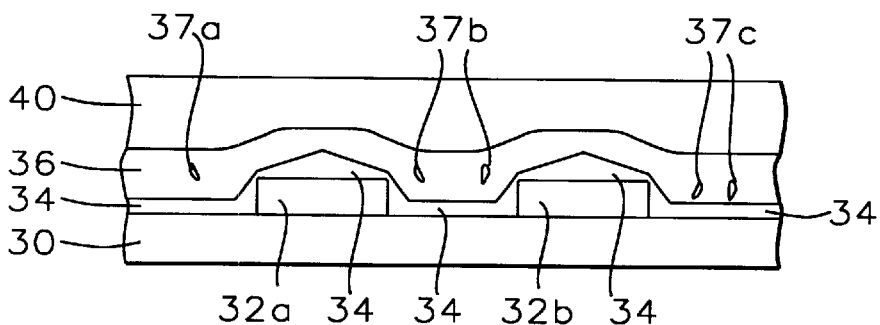

Referring now to FIG. 5 to FIG. 7, there is shown a series of schematic cross-sectional diagrams illustrating the results of forming, upon a substrate employed within a microelectronics fabrication in accord with a more specific embodiment of the method of the present invention which constitutes a second preferred embodiment of the present invention, an inter-level metal dielectric layer disposed between and around a patterned microelectronics conductor layer, formed employing silicon oxide dielectric materials deposited successively by chemical vapor deposition (CVD) methods and containing concentrations of internal voids determined by forming the second silicon oxide dielectric layer without exposure of the first silicon oxide dielectric layer to a nitrogen plasma prior to deposition of the second silicon oxide dielectric layer. FIG. 5 is a schematic cross-sectional diagram of a microelectronics fabrication at an early stage in its fabrication in accord with the method of the second preferred embodiment of the present invention.

Shown in FIG. 5 is a substrate 30 having formed over and upon it patterned microelectronics conductor layers 32a and 32b having linewidths X4 and X6 separated by a gap X5. Formed over the substrate 30 and patterned. microelectronics conductor layers 32a and 32b is a blanket first silicon oxide dielectric layer 34 formed to a thickness H3.

With respect to the substrate 30 shown in FIG. 5, the substrate 30 is analogous or equivalent to the substrate 10 shown in FIG. 1 of the method of the first preferred embodiment of the present invention. With respect to the patterned microelectronics conductor layers 32a and 32b, the patterned microelectronics conductor layers 32a and 32b may be formed from materials selected from the group including but not limited to microelectronics metallic materials, microelectronics alloy materials, microelectronics metallic compound conducting materials and microelectronics semiconductor materials formed by methods selected from the group including but not limited to thermal evaporation, electron beam evaporation, sputtering, chemical vapor deposition and reactive sputtering. Patterns of microelectronics conductor layers may be formed employing photolithographic methods and materials as are known in the art of microelectronics fabrication.

With respect to the blanket first silicon oxide dielectric layer 34, the blanket first silicon oxide dielectric layer 34 is analogous or equivalent to the blanket first silicon oxide dielectric layer 14 shown in FIG. 1 of the first preferred embodiment of the present invention.

Referring now to FIG. 6, there is shown a schematic cross-sectional diagram illustrating the results of further processing of the microelectronics fabrication whose schematic cross-sectional diagram is shown in FIG. 5 in accord with the second preferred embodiment of the present invention. Shown in FIG. 6 is a microelectronics fabrication otherwise equivalent to the microelectronics fabrication shown in FIG. 5, but where there has been formed without exposure to a nitrogen plasma a blanket second silicon oxide dielectric layer 36 of thickness H4 with internal voids 37a; 37b and 37c.

With respect to the blanket second silicon oxide dielectric layer 36, the blanket silicon oxide dielectric layer 36 has been formed employing methods and materials analogous or equivalent to the materials and methods employed to form the blanket second silicon oxide dielectric layer 16 shown in FIG. 3 of the first preferred embodiment of the present invention. The voids 37a, 37b, and 37c present in the silicon oxide dielectric layer 36 have formed as a consequence of not exposing the blanket first silicon oxide dielectric layer 34 to a nitrogen plasma prior to formation of the second silicon oxide blanket dielectric layer 36. Preferably, the blanket second silicon oxide dielectric layer 36 is formed to a thickness H4 of from about 3000 to about 6000 angstroms, depending on the height of the conductor.

Referring now to FIG. 7, there is shown a schematic cross-sectional diagram illustrating the results of further processing of the microelectronics fabrication whose schematic cross-sectional diagram is shown in FIG. 6 in accord with the second preferred embodiment of the present invention. Shown in FIG. 7 is a microelectronics fabrication otherwise equivalent to the microelectronics fabrication shown in FIG. 6, but where there has been formed a blanket dielectric layer 40 which is a capping layer formed over the substrate.

With respect to the blanket dielectric layer 40, the blanket dielectric layer 40 is formed employing gap filling silicon oxide dielectric material deposited employing plasma enhanced chemical vapor deposition (PECVD) analogous or equivalent to the silicon oxide dielectric layer 20 shown in FIG. 4 of the first preferred embodiment of the method of the present invention. An optional nitrogen plasma treatment of the second silicon oxide dielectric layer prior to formation of the blanket dielectric layer may be beneficial in promoting enhanced quality of the blanket dielectric layer.

There is formed as a result of practicing the method of the second preferred embodiment of the present invention an inter-level metal dielectric layer upon a patterned conductor layer upon a substrate within a microelectronics fabrication, where the inter-level metal dielectric layer formed in the absence of a prior nitrogen plasma treatment contains a controlled void concentration between the lines of the patterned microelectronics conductor layer, the void concentration providing a lower average dielectric constant for the silicon oxide inter-level metal dielectric layer.

Third Preferred Embodiment

Figure 8:
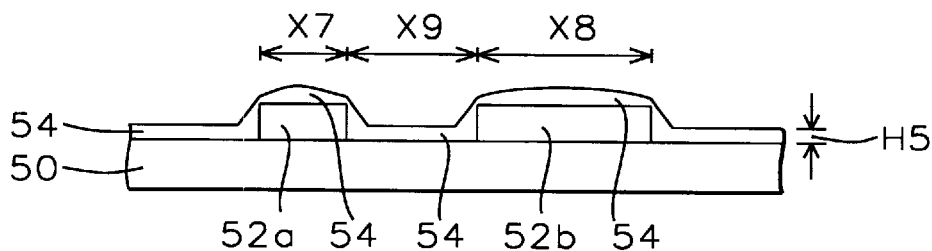
FIG. 8, FIG. 9, FIG. 10 and FIG. 11 are directed towards a yet more specific embodiment of the present invention which constitutes a third preferred embodiment of the present invention. Shown in FIG. 8 to FIG. 11 is a series of schematic cross-sectional diagrams illustrating the results of forming upon a semiconductor substrate employed within an integrated circuit microelectronics fabrication an inter-level metal dielectric layer formed by successive deposition of silicon oxide dielectric materials, between and around a patterned microelectronics conductor layer, where the void content of the silicon oxide dielectric layer is enhanced between the lines of the conductor pattern to achieve a lower average dielectric constant therein.

Referring now to FIG. 8 to FIG. 11, there is shown a series of schematic cross-sectional diagrams illustrating the results of forming, upon a semiconductor substrate employed within an integrated circuit microelectronics fabrication in accord with a more specific embodiment of the present invention which constitutes a third preferred embodiment of the present invention, an inter-level metal dielectric layer disposed between and around a patterned microelectronics conductor layer, formed employing silicon oxide dielectric materials deposited successively by chemical vapor deposition (CVD) with internal void concentrations determined by not exposing the first silicon oxide dielectric layer to a nitrogen plasma prior to deposition of the second silicon oxide dielectric layer. FIG. 8 is a schematic cross-sectional diagram of an integrated circuit microelectronics fabrication at an early stage in its fabrication.

Shown in FIG. 8 is a semiconductor substrate 50 having formed within and upon it a series of first patterned microelectronics conductor layers 52a and 52b comprising linewidths X7 and X8 separated by a gap X9, where X7 and X8 are unequal. Formed over the first patterned microelectronics conductor layers 52a and 52b is a blanket first silicon oxide layer 54 formed to a thickness H5.

With respect to the semiconductor substrate 50, the semiconductor substrate 50 is a silicon semiconductor substrate. Preferably, the silicon semiconductor substrate 50 is a silicon substrate of (100) crystal orientation having P- or N-type doping. Although not shown in FIG. 8, the silicon semiconductor substrate 50 may contain integrated circuit devices and features as are known in the art of integrated circuit microelectronics fabrication comprising, for example, field-effect transistor (FET) devices.

With respect to the first patterned microelectronics conductor layers 52a and 52b, the first patterned microelectronics conductor layers 52a and 52b are formed employing materials and methods analogous or equivalent to the materials and methods employed to form the patterned microelectronics conductor layers 32a and 32b shown in FIG. 5 of the method of the second preferred embodiment of the present invention.

Figure 9:
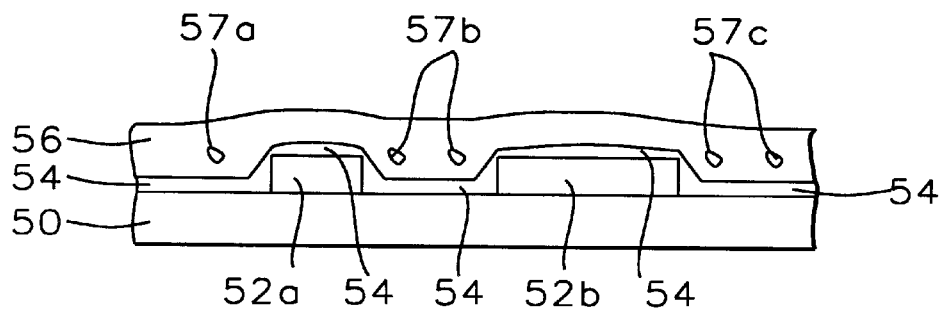

Referring now to FIG. 9, there is shown a schematic cross-sectional diagram illustrating the results of further processing of the integrated circuit microelectronics fabrication whose schematic cross-sectional diagram is shown in FIG. 8 in accord with the third preferred embodiment of the present invention. Shown in FIG. 9 is an integrated circuit microelectronics fabrication otherwise equivalent to the integrated circuit microelectronics fabrication shown in FIG. 8, but where there is formed over the substrate in the absence of a nitrogen plasma treatment a blanket second silicon oxide dielectric layer 56 with internal voids 57a, 57b and 57c.

With respect to the blanket second silicon oxide dielectric layer 56, the blanket second silicon oxide dielectric layer 56 is formed analogous to the blanket second dielectric layer 36 shown in FIG. 6 of the second preferred embodiment of the present invention. The different linewidths X7 and X8 of the patterned microelectronics conductor layers 52a and 52b result in different thicknesses of the blanket silicon oxide dielectric layer 54 being formed over them, with the wider linewidth X8 having the greater thickness of silicon oxide formed thereupon.

Figure 10:
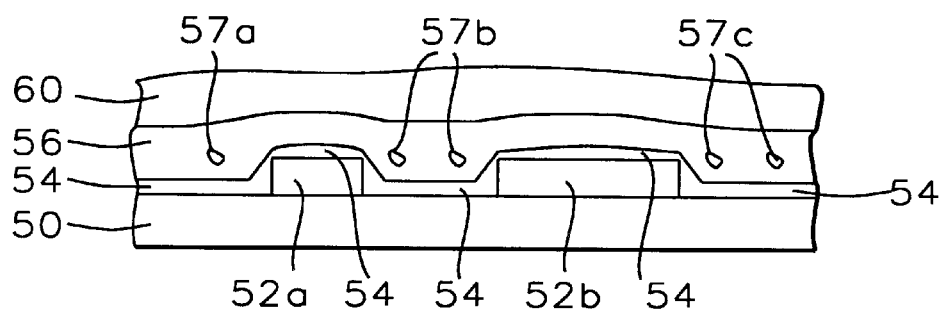

Referring now to FIG. 10, there is shown a schematic cross-sectional diagram illustrating the results of further processing of the integrated circuit microelectronics fabrication whose schematic cross-sectional diagram is shown in FIG. 9 in accord with the third preferred embodiment of the present invention. Shown in FIG. 10 is an integrated circuit microelectronics fabrication otherwise equivalent to the integrated circuit microelectronics fabrication shown in FIG. 9, but where there has been formed over the substrate a blanket dielectric layer 60 which forms a capping layer.

With respect to the blanket dielectric layer 60 shown in FIG. 10, the blanket dielectric layer 60 is a silicon oxide dielectric layer analogous or equivalent to the blanket dielectric 20 layer shown in FIG. 4 of the first preferred embodiment of the present invention.

Figure 11:
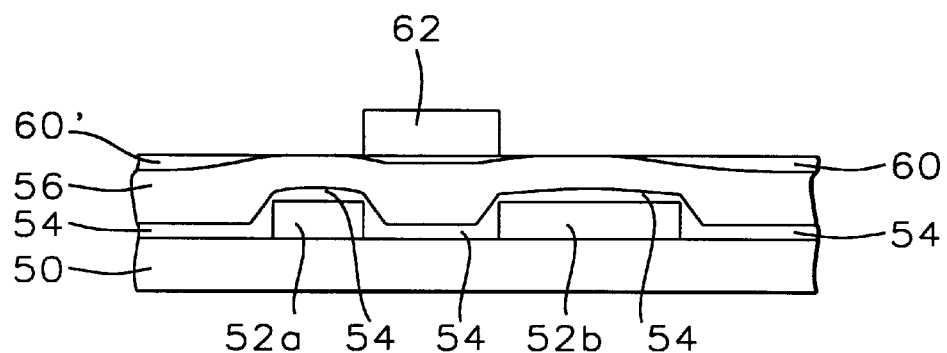

Referring now to FIG. 11, there is shown a schematic cross-sectional diagram illustrating the results of final processing of the microelectronics fabrication whose schematic cross-sectional diagram is shown in FIG. 10 in accord with the third preferred embodiment of the present invention. Shown in FIG. 11 is a microelectronics fabrication otherwise equivalent to the microelectronics fabrication shown in FIG. 10, but where there has been planarized the blanket dielectric layer 60'. Formed over the planar surface of the dielectric layer 60' is an optional patterned microelectronics conductor layer 62.

With respect to the planarized surface of the blanket dielectric layer 60', the blanket dielectric layer 60' may be planarized by chemical mechanical polish (CMP) planarizing methods as are well known in the art of microelectronics fabrication if further patterned conductor layers such as the optional patterned microelectronics conductor layer 62 are employed. The optional patterned microelectronics conductor layer 62 is analogous or equivalent to the patterned microelectronics conductor layers 32a and 32b shown in FIG. 5 of the second preferred embodiment of the present invention, or the patterned microelectronics conductor layers 52a and 52b shown in FIG. 8 of the third preferred embodiment of the present invention.

There is formed as a result of the third preferred embodiment of the present invention an inter-level metal dielectric layer upon a patterned microelectronics conductor layer upon a silicon substrate employed within an integrated circuit microelectronics fabrication, where the inter-level metal dielectric layer formed in the absence of a prior nitrogen plasma treatment contains a concentration of voids within the silicon oxide layer between the lines of the patterned microelectronics conductor layer, resulting in a lower average dielectric constant therein.

EXAMPLES

The advantages and benefits of the present invention are demonstrated by the following examples, which illustrate the results of measurements performed upon experimental samples of microelectronics fabrications. In the first example, designated as Example I, experimental samples were fabricated in accord with the first preferred embodiment of the present invention and compared with samples fabricated in accord with the method of the prior art.

The experimental samples, designated as Example Ia, and the control samples designated as Example Ib, were fabricated in accord with the method of the prior art and the present invention, and possessed the structure schematically illustrated in FIG. 1. All samples were fabricated employing silicon substrates upon which were formed over a patterned microelectronics layer comprising lines of width X1 and X2 separated by a gap of width X3 a first blanket silicon oxide dielectric layer. Samples 1a were fabricated wherein the first blanket silicon oxide dielectric layer was deposited employing plasma enhanced chemical vapor deposition (PECVD). Samples 1b were fabricated wherein the blanket first silicon oxide layer was deposited in accord with the preferred first embodiment of the present invention by sub-atmospheric pressure thermal chemical vapor deposition (SACVD). All substrates were exposed to a nitrogen plasma treatment and subsequently a second blanket silicon oxide dielectric layer was formed over all substrates employing sub-atmospheric pressure thermal chemical vapor deposition (SACVD). After deposition of a blanket dielectric layer which served as a capping layer, the samples were analysed by micro-sectioning. The results are tabulated in Table I, which gives the results of examination of the micro-sections.

TABLE I

| Prior Art | | Present Invention (Metal Height 6000 angstroms) | |
|---|---|---|---|
| (Metal Height 6000 angstroms) | | X1, width, | |
| X1 width, microns | X3 gap, voids | microns | X3 gap, voids |
| 0.33 | large voids | 0.33 | seam |
| 0.34 | voids | 0.37 | none |
| 0.39 | voids | 0.39 | none |
| 0.41 | small voids | 0.41 | none |
| 0.44 | small voids | 0.44 | none |
| 0.48 | very small voids | 0.48 | none |
| 0.60 | no voids | 0.60 | none |

The formation of voids is enhanced by narrow gaps between lines, as is shown by the results in Table I for the control samples. The advantage of the method of the first preferred embodiment of the present invention is clearly demonstrated, wherein the combination of HDP-CVD method of forming the blanket first silicon oxide dielectric layer and the nitrogen plasma treatment improves gap fill capability.

In the second example, designated as Example II, the advantages of the second preferred embodiment of the present invention are demonstrated. Samples designated as II$a$ were fabricated in accord with the prior art and compared to samples designated as II$b$, which were fabricated in accord with the method of the preferred embodiment of the present invention Samples designated as IIA were equivalent to control samples designated as I$a$ Experimental samples designated as II$b$ were otherwise equivalent to experimental samples I$a$ but wherein there was no nitrogen plasma exposure treatment. Samples were analysed by micro-sectioning in the same fashion as in Example I. The results are summarized in Table II:

TABLE II

| (Metal Thickness 6000 angstroms) | | |
|---|---|---|
| X1 width, microns | X3 width, microns | X3, voids |
| >0.5 | >0.5 | none |
| 0.45 | 0.45 | small voids |
| 0.42 | 0.42 | voids |
| 0.40 | 0.40 | voids |
| 0.37 | 0.37 | voids |
| 0.35 | 0.35 | voids |

The results in Table II show that no exposure to nitrogen plasma treatment results in reasonably uniform formation of voids within the blanket second silicon oxide dielectric layer within the range of gap widths between lines of the samples. Such a concentration of voids results in a lower average dielectric constant for the dielectric material in the gap between the lines.

The X1 line and X3 gap widths of the patterned microelectronics layer upon which the blanket first and second silicon oxide dielectric layers are formed have an effect on the silicon oxide layer thickness thereon. Wide lines which are separated by wide gaps have a lesser thickness of overlying silicon oxide dielectric material than either narrow lines separated by wide gaps or narrow lines separated by narrow gaps. The dimensions of the patterned layers over which the blanket silicon oxide dielectric layers are formed thus afford an additional measure of control over the behavior of the microelectronics fabrication beyond the choice of method of deposition and amount of nitrogen plasma treatment.

As is understood by a person skilled in the art, the preferred embodiments of the present invention are illustrative of the present invention rather than limiting of the present invention. Revisions and modifications may be made to materials, structures and dimensions through which is provided the preferred embodiments of the present invention while still providing embodiment s which are within the spirit and scope of the present invention as defined by the appended claims.

What is claimed is:

1. A method for forming upon a substrate employed within a microelectronics fabrication a dielectric layer comprising:

providing a substrate;

forming upon the substrate a patterned microelectronics layer; the patterned microelectronics layer comprising at least two adjacent layers separated by a gap of from about 0.2 to 1.0 microns, and each of the adjacent layers having a linewidth from about 0.2 to 1.0 microns;

forming upon the patterned microelectronics layer and portions of the substrate exposed through the patterned microelectronics layer a first dielectric layer, the first dielectric layer being a silicon oxide dielectric layer formed employing a high density plasma chemical vapor deposition (HDP-CVD) method;

exposing the first dielectric layer to a plasma to form a plasma treated first dielectric layer; and forming upon the plasma treated first dielectric layer a blanket second dielectric layer, the blanket second dielectric layer being a silicon oxide dielectric layer formed employing an ozone assisted sub-atmospheric pressure thermal chemical vapor deposition (SACVD) method.

2. The method of claim 1 wherein by plasma treatment of the first dielectric layer to form the plasma treated first dielectric layer, the second dielectric layer is formed with attenuated voids.

3. The method of claim 1 further comprising:

forming upon the substrate a capping silicon oxide dielectric layer formed employing plasma enhanced chemical vapor deposition (PECVD).

4. The method of claim 1 wherein the substrate is selected from the group consisting of:

microelectronics conductor materials;

microelectronics semiconductor materials; and microelectronics dielectric materials.

5. The method of claim 1 wherein the microelectronics fabrication is selected from the group consisting of:

integrated circuit microelectronics fabrications;

charge coupled device microelectronics fabrications;

solar cell microelectronics fabrications;

ceramic substrate microelectronics fabrications; and flat panel display microelectronics fabrications.

6. The method of claim 1 wherein the patterned microelectronics layer is formed from materials selected from the group consisting of:
- microelectronics conductor materials;
- microelectronics semiconductor materials; and
- microelectronics dielectric materials.

7. The method of claim 1 wherein the plasma is a nitrogen plasma.

8. The method of claim 1, wherein the first dielectric layer is formed employing:
- a silane gas flow rate of from about 50 to 70 sccm;
- an oxygen gas flow of from about 90 to 110 sccm;
- an argon carrier gas flow rate of from about 100 to about 130 sccm;
- a total reactor chamber pressure of from about 6 to about 8 mTorr;
- a source power of from about 4000 to about 5000 watts;
- a bias power of from about 2500 to about 3000 watts; and
- a temperature of from about 380 to about 420° C.;

the first dielectric layer having a thickness of from about 700 to 1200 Å.

9. The method of claim 1, wherein the exposure of the first dielectric layer to a plasma employs:
- a chamber pressure of from about 1 to about 2 torr;
- a nitrogen gas flow rate of from about 400 to about 600 sccm;
- a helium carrier gas from about 1500 to about 2500 sccm;
- a power of from about 400 to about 600 watts;
- a temperature of from about 380 to about 420° C.;
- an exposure time of from about 60 to about 120 seconds; and
- a susceptor spacing of from about 0.4 to about 0.5 inches.

10. The method of claim 1, wherein the blanket second dielectric layer is formed employing:
- a TEOS vapor flow rate of from about 250 to about 350 milligrams per minute;
- an ozone gas flow rate of from about 4500 to about 5300 sccm;
- a temperature of from about 380 to about 450° C.;
- a helium gas flow rate of from about 3500 to about 4500 sccm;
- a chamber pressure of from about 400 to about 500 torr; and
- a susceptor spacing of from about 0.20 to about 0.25 inches;

the blanket second silicon oxide layer having a thickness of from about 3000 to 6000 Å.

11. The method of claim 1, including the step of forming upon the blanket second dielectric layer a cap layer employing a plasma enhanced chemical vapor deposition (PECVD) method at the conditions:
- a TEOS gas flow rate of from about 800 to about 1200 milligrams/minute;
- an oxygen gas flow rate of from about 800 to about 1200 sccm;
- a chamber pressure of from about 7.5 to about 8.5 torr;
- a power of from about 800 to about 1000 watts;
- a temperature of from about 380 to about 420° C.;
- a susceptor spacing of from about 0.25 to about 0.30 inches; and
- a helium gas flow rate of from about 800 to about 1200 sccm;

the blanket dielectric layer having a thickness of from about 15000 to about 20000 Å.

12. A method for forming upon a substrate employed within a microelectronics fabrication an inter-level dielectric layer comprising:
- providing a substrate;
- forming upon the substrate a patterned microelectronics conductor layer; the patterned microelectronics conductor layer comprising at least two adjacent conductor layers separated by a gap of from about 0.2 to 1.0 microns, and each of the adjacent conductor layers having a linewidth from about 0.2 to 1.0 microns;
- forming upon the patterned microelectronics conductor layer and portions of the substrate exposed through the patterned microelectronics layer a first dielectric layer, the first dielectric layer being a silicon oxide dielectric layer formed employing a high density plasma chemical vapor deposition (HDP-CVD) method; and
- forming with no exposure to plasma treatment upon the first dielectric layer a blanket second dielectric layer, the blanket second dielectric layer being a silicon oxide dielectric layer formed employing a sub-atmospheric pressure thermal chemical vapor deposition (SACVD) method.

13. The method of claim 12 further comprising:
- forming upon the substrate a capping blanket silicon oxide dielectric layer formed employing a plasma enhanced chemical vapor deposition (PECVD) method.

14. The method of claim 12 wherein the substrate is selected from the group consisting of:
- microelectronics conductor materials;
- microelectronics semiconductor materials; and
- microelectronics dielectric materials.

15. The method of claim 12 wherein the microelectronics fabrication is selected from the group consisting of:
- integrated circuit microelectronics fabrications;
- charge coupled device microelectronics fabrications;
- solar cell microelectrornics fabrications;
- ceramic substrate microelectronics fabrications; and
- flat panel display microelectronics fabrications.

16. The method of claim 12 wherein the patterned microelectronics conductor layer is formed from materials selected from the group consisting of:
- microelectronics metallic materials;
- microelectronics alloy conductor materials;
- microelectronics semiconductor materials, and
- microelectronics conductive compound materials.

17. The method of claim 12 wherein the blanket second silicon oxide dielectric layer is formed with void content controlled by the dimensions of the patterned microelectronics layer and the avoidance of plasma exposure treatment.

18. The method of claim 12, wherein the first dielectric layer is formed employing:
- a silane gas flow rate of from about 50 to 70 sccm;
- an oxygen gas flow of from about 90 to 110 sccm;
- an argon carrier gas flow rate of from about 100 to about 130 sccm;
- a total reactor chamber pressure of from about 6 to about 8 mTorr;
- a source power of from about 4000 to about 5000 watts;
- a bias power of from about 2500 to about 3000 watts; and a temperature of from about 380 to about 420° C.;
the first dielectric layer having a thickness of from about 700 to 1200 Å.

19. The method of claim 12, wherein the blanket second dielectric layer is formed employing:
   a TEOS vapor flow rate of from about 250 to about 350 milligrams per minute;
   an ozone gas flow rate of from about 4500 to about 5300 sccm;
   a temperature of from about 380 to about 450° C.;
   a helium gas flow rate of from about 3500 to about 4500 sccm;
   a chamber pressure of from about 400 to about 500 torr; and
   a susceptor spacing of from about 0.20 to about 0.25 inches;
the blanket second silicon oxide layer having a thickness of from about 3000 to 6000 Å.

20. The method of claim 12 further comprising:
   forming upon the substrate a capping blanket silicon oxide dielectric layer formed employing a plasma enhanced chemical vapor deposition (PECVD) method at the conditions:
      a TEOS gas flow rate of from about 800 to about 1200 milligrams/minute;
      an oxygen gas flow rate of from about 800 to about 1200 sccm;
      a chamber pressure of from about 7.5 to about 8.5 torr;
      a power of from about 800 to about 1000 watts;
      a temperature of from about 380 to about 420° C.;
      a susceptor spacing of from about 0.25 to about 0.30 inches; and
      a helium gas flow rate of from about 800 to about 1200 sccm;
the blanket dielectric layer having a thickness of from about 15000 to about 20000 Å.

21. The method of claim 12 wherein the blanket second silicon oxide dielectric layer is formed with a void concentration controlled by the dimensions of the patterned microelectronics layer and the avoidance of plasma exposure treatment; the void concentration providing a decreased average dielectric constant for the blanket second silicon oxide dielectric layer.

22. The method of claim 12, wherein the blanket second dielectric layer is exposed to a plasma employing:
   a chamber pressure of from about 1 to about 2 torr;
   a nitrogen gas flow rate of from about 400 to about 600 sccm;
   a helium carrier gas from about 1500 to about 2500 sccm;
   a power of from about 400 to about 600 watts;
   a temperature of from about 380 to about 420° C.;
   an exposure time of from about 60 to about 120 seconds; and
   a susceptor spacing of from about 0.4 to about 0.5 inches.

23. A method for forming upon a semiconductor substrate employed within an integrated circuit microelectronics fabrication an inter-level dielectric layer comprising:
   providing a semiconductor substrate;
   forming upon the semiconductor substrate a first patterned microelectronics conductor layer; the patterned microelectronics conductor layer comprising at least two adjacent conductor layers separated by a gap of from about 0.2 to 1.0 microns, and each of the adjacent conductor layers having a linewidth from about 0.2 to 1.0 microns;
   forming upon the patterned microelectronics conductor layer and portions of the semiconductor substrate exposed through the patterned microelectronics conductor layer a blanket first dielectric layer, the blanket first dielectric layer being a silicon oxide dielectric layer formed employing a high density plasma chemical vapor deposition (HDP-CVD) method; and
   forming with no exposure to plasma treatment upon the blanket first dielectric layer a blanket second dielectric layer, the blanket second dielectric layer being a silicon oxide dielectric layer formed employing an ozone assisted sub-atmospheric pressure thermal chemical vapor deposition (SACVD) method.

24. The method of claim 23 further comprising:
   forming upon the substrate a planar capping layer blanket dielectric layer, and
   forming upon the planar blanket dielectric layer a second patterned microelectronics conductor layer.

25. The method of claim 23 wherein the semiconductor substrate is a silicon semiconductor substrate.

26. The method of claim 23 wherein the patterned microelectronics layers are formed from microelectronics materials selected from the group comprising:
   microelectronics metallic materials;
   microelectronics metallic alloy materials;
   microelectronics conductive compound materials; and
   microelectronics semiconductor materials.

27. The method of claim 23 wherein the second silicon oxide dielectric layer is formed with void content controlled by the dimensions of the first patterned microelectronics conductor layer and the avoidance of plasma exposure treatment.

28. The method of claim 23 where the planar capping blanket dielectric layer is formed employing a gap filling silicon oxide dielectric material planarized by a chemical mechanical polish (CMP) planarizing method.

29. The method of claim 23, wherein the blanket first dielectric layer is formed employing:
   a silane gas flow rate of from about 50 to 70 sccm;
   an oxygen gas flow of from about 90 to 110 sccm;
   an argon carrier gas flow rate of from about 100 to about 130 sccm;
   a total reactor chamber pressure of from about 6 to about 8 mTorr;
   a source power of from about 4000 to about 5000 watts;
   a bias power of from about 2500 to about 3000 watts; and
   a temperature of from about 380 to about 420° C.;
the first dielectric layer having a thickness of from about 700 to 1200 Å.

30. The method of claim 23, wherein the blanket second dielectric layer is formed employing:
   a TEOS vapor flow rate of from about 250 to about 350 milligrams per minute;
   an ozone gas flow rate of from about 4500 to about 5300 sccm;
   a temperature of from about 380 to about 450° C.;
   a helium gas flow rate of from about 3500 to about 4500 sccm;
   a chamber pressure of from about 400 to about 500 torr; and
   a susceptor spacing of from about 0.20 to about 0.25 inches;
the blanket second silicon oxide layer having a thickness of from about 3000 to 6000 Å.

31. The method of claim 23 further comprising:

forming upon the substrate a capping blanket silicon oxide dielectric layer formed employing a plasma enhanced chemical vapor deposition (PECVD) method at the conditions:
- a TEOS gas flow rate of from about 800 to about 1200 milligrams/minute;
- an oxygen gas flow rate of from about 800 to about 1200 sccm;
- a chamber pressure of from about 7.5 to about 8.5 torr;
- a power of from about 800 to about 1000 watts;
- a temperature of from about 380 to about 420° C.;
- a susceptor spacing of from about 0.25 to about 0.30 inches; and
- a helium gas flow rate of from about 800 to about 1200 sccm;

the blanket dielectric layer having a thickness of from about 15000 to about 20000 Å.

32. The method of claim 23 wherein the blanket second silicon oxide dielectric layer is formed with a void concentration controlled by the dimensions of the patterned microelectronics layer and the avoidance of plasma exposure treatment; the void concentration providing a decreased average dielectric constant for the blanket second silicon oxide dielectric layer.

* * * * *